(12) United States Patent
Sack et al.

(10) Patent No.: US 7,202,730 B2
(45) Date of Patent: Apr. 10, 2007

(54) VOLTAGE TO CURRENT TO VOLTAGE CELL VOLTAGE MONITOR (VIV)

(75) Inventors: Thomas T. Sack, Cockeysville, MD (US); Philip K. Hoffman, Cockeysville, MD (US)

(73) Assignee: SAFT, Bagnolet (FR)

( * ) Notice: Subject to any disclaimer, the term of this patent is extended or adjusted under 35 U.S.C. 154(b) by 153 days.

(21) Appl. No.: 11/120,993

(22) Filed: May 4, 2005

(65) Prior Publication Data

US 2006/0250166 A1  Nov. 9, 2006

(51) Int. Cl.
G05F 1/10 (2006.01)
(52) U.S. Cl. .................. 327/543; 327/541; 327/538
(58) Field of Classification Search ........... 327/538, 327/540, 541, 543; 323/313, 315
See application file for complete search history.

(56) References Cited

U.S. PATENT DOCUMENTS

| | | | | |
|---|---|---|---|---|
| 4,495,425 A | * | 1/1985 | McKenzie | ............ 327/541 |
| 5,910,723 A | | 6/1999 | Perelle | ............ 320/119 |
| 5,926,062 A | * | 7/1999 | Kuroda | ............ 327/538 |
| 6,166,549 A | | 12/2000 | Ashtiani et al. | ............ 324/434 |
| 6,411,097 B1 | | 6/2002 | Ashtiani et al. | ............ 324/434 |
| 6,466,083 B1 | * | 10/2002 | Barnes | ............ 327/543 |

* cited by examiner

Primary Examiner—Long Nguyen
(74) Attorney, Agent, or Firm—Sughrue Mion, PLLC

(57) ABSTRACT

A voltage measurement circuit is provided which converts a voltage of a first voltage source connected in series with an offset voltage source to an output voltage, including first and second current mirrors for accurately measuring voltage so as to provide a proportional output voltage with the offset voltage removed. Further, voltage measurements can be precisely determined for each of a plurality of voltage sources, such as a plurality of electrochemical cells in a series electrical connection. By virtue of the voltage measurement circuit, the effect of different offset voltage values on the measured voltage is minimized. Also, the voltage measurement circuit exhibits enhanced stability to variations in operating temperature. Accordingly, accuracy of voltage measurements where offset voltages are present is improved.

19 Claims, 6 Drawing Sheets

VOLTAGE TO CURRENT TO VOLTAGE CELL VOLTAGE MONITOR (VIV)

BACKGROUND OF THE INVENTION

1. Field of the Invention

Apparatuses and methods consistent with the present invention relate to measurement of voltage levels of voltage sources involving conversion of voltage values.

2. Description of the Related Art

In voltage measurement applications, a voltage which is monitored may include an offset voltage from an offset voltage source, such as where a plurality of electrochemical cells are connected in series. By connecting a plurality of electrochemical cells in this manner, the voltage of each of the individual cells is added. Accordingly, the total voltage of the series connected electrochemical cells may be provided as a power source for applications where the desired voltage exceeds the voltage of an individual cell.

Further, many applications require operating voltages that are significantly higher than the voltage of a single cells. In these applications, numerous individual electrochemical cells may be connected in series to provide the required operating voltage. Also, many applications which utilize electrochemical cells involve using cells that are rechargeable, such as lithium ion cells. In these applications, the voltage of the cells is monitored to determine when the cells require recharging. Further, the voltages of the individual cells are monitored to regulate the charging such that overcharging of the cells, which could damage the cells, does not occur.

In addition, when a plurality of cells are connected in series to provide a power source, it is desirable to monitor the voltage level of each of the cells individually. Because the total voltage capacity and the discharge rate of each cell may vary with respect to other cells in the series connection, the voltage of some cells may be lower than others. Accordingly, the efficiency of a circuit may be diminished due to less than optimal charging of each of individual cells.

Therefore, monitoring circuits have been developed which allow each cell voltage to be monitored. For example, prior approaches involve the use of resistor divider circuits and differential amplifier circuits which measure the voltage of the individual cells. Given a measurement of each individual cell, the voltage value may be provided to a charge controlling circuit which accepts inputs from the measurement circuits for each of the electrochemical cells. For example, a charge controlling circuit may be a microcontroller or other processor which regulates a charging current that is applied to each of the cells when it is determined that a cell requires charging. Further, the amplitude of the measure voltage may be provided as an analog input which is then converted to a digital value for processing by the charge controlling device.

Typically, monitoring circuits accept input voltage levels that are substantially lower than the total voltage that is observed from an individual cell voltage with the offset voltage produced by other cells in the series connection. For instance, input voltage levels may typically be limited to a maximum of 5 volts. Accordingly, it is frequently necessary to convert the total voltage of each cell in a series connection down to a voltage value that represents the voltage of the cell without the presence of the offset voltage from the other cells.

However, monitoring circuits based upon differential amplifiers and resistor divider circuits suffer from excessive current draw as the number of cells are added to the series string increases, thereby resulting in higher background energy losses. In many applications, such excessive current draw leads to substantial reduction in the operating time of battery powered circuits. Thus, the efficiency of the device may be decreased.

In addition, measuring circuits which utilize resistors connected in a plurality of resistor divider networks suffer from accuracy errors due to attenuation of the measurement signal which reduces resolution in measuring the signal. Therefore, resistor divider measuring circuits are unable to accurately determine small deviations in voltage levels of the individual cells. Further, commercially available amplifiers and multiplexors which are used in conventional monitoring circuits are limited by the supply voltage which must be provided from the cells in order to operate the devices.

Also, conventional approaches suffer from a lack of accuracy when the offset voltage varies. Thus, increased offset voltage levels resulting from a large number of series connected cells may give rise to an increasing error in the measured voltage. Measurement error also results in conventional approaches due to variations in operating temperature of the measurement circuit.

Additionally, different approaches have been put forward that involve putting a smaller collection of cells in modules that do not violate the limits of the integrated circuits. However, this approach raises the cost of the components in the measurement circuit because of the increased number of microprocessors for each of the smaller modules and reduces the ability to build standalone cell batteries which have a series connection of 16 cells or more.

SUMMARY OF THE INVENTION

In one aspect of the present invention, a voltage measurement circuit is provided for converting a voltage of a first voltage source connected in series with an offset voltage source to an output voltage, comprising a first resistor connected to a first terminal of the first voltage source, a first transistor and a second transistor connected as a first current mirror, wherein the first transistor is connected to a second terminal of the first voltage source and the second transistor is connected to the first resistor. The voltage measurement circuit further includes a third transistor and a fourth transistor connected as a second current mirror, wherein the third transistor is connected to the first transistor, and the fourth transistor is connected to the second transistor. Additionally, a fifth transistor is connected to the fourth transistor, a second resistor is connected between the third transistor and a reference potential, and a third resistor connected between the fifth transistor and the reference potential. Further, an output voltage formed by a current flowing through the third resistor is proportional to the voltage of the first voltage source with the offset voltage removed.

In another aspect of the present invention, a voltage measurement circuit is provided for converting voltages of a plurality of electrochemical cells connected in series to output voltages which are independent of offset voltage, comprising a plurality of electrochemical cells connected in series, and for each electrochemical cell, a measurement module. Further, each measurement module comprises a first resistor connected to a first terminal of an electrochemical cell, a first transistor and a second transistor connected as a first current mirror, wherein the first transistor is connected to a second terminal of the first voltage source and the second transistor is connected to the first resistor. The measuring module further comprises a third transistor and a fourth transistor connected as a second current mirror, wherein the third transistor is connected to the first transistor, and the fourth transistor is connected to the second transistor, a fifth transistor connected to the fourth transistor, a second resistor connected between the third transistor and a reference potential, and a third resistor connected between the fifth transistor and the reference potential. Thus, an output voltage formed by a current flowing through the third resistor is proportional to the voltage for each electrochemical cell with the offset voltage removed.

BRIEF DESCRIPTION OF THE DRAWINGS

The aspects of the present invention will become more apparent by describing in detail illustrative, non-limiting embodiments thereof with reference to the accompanying drawings, in which.

DETAILED DESCRIPTION OF THE INVENTION

Figure 1A:
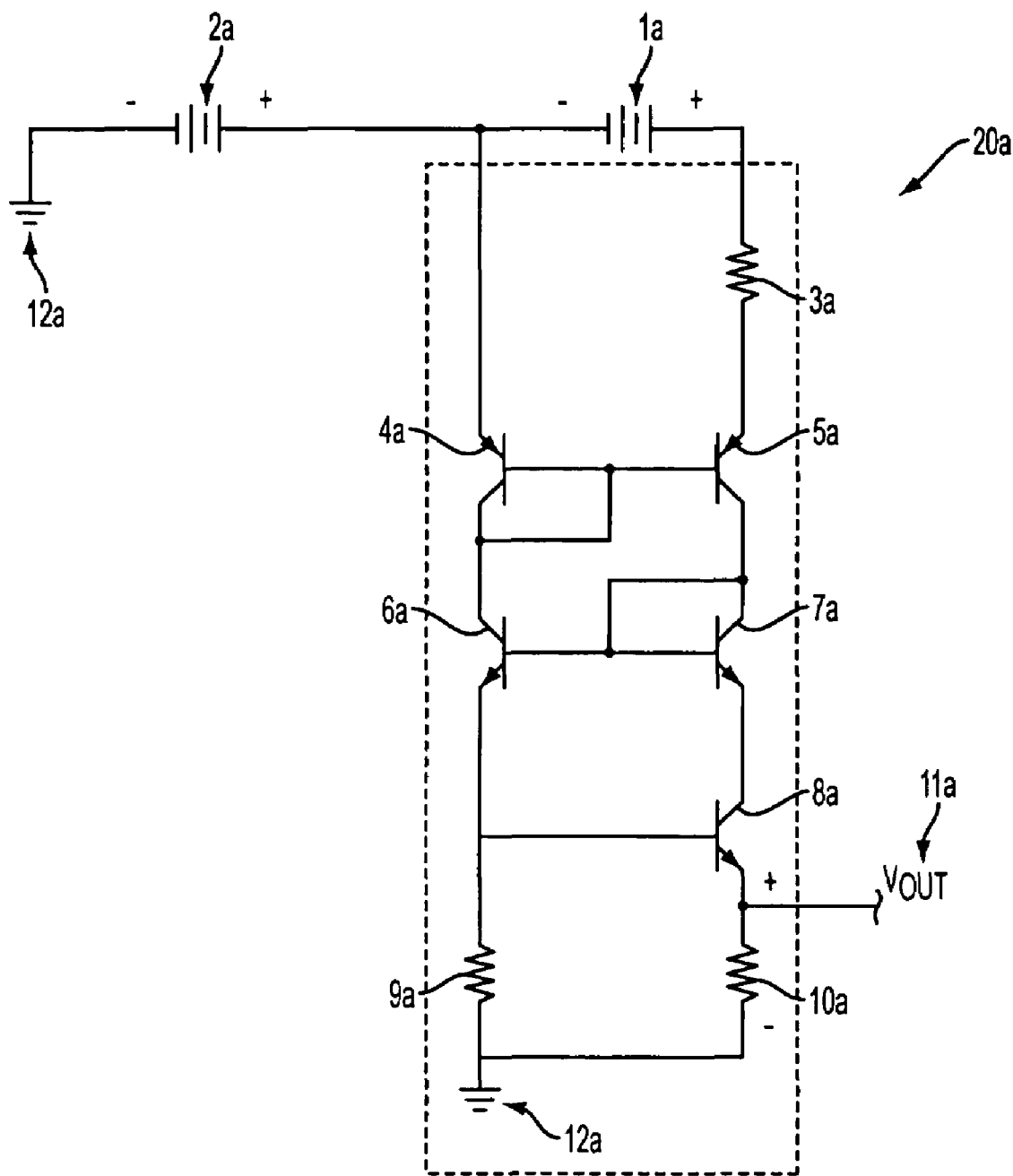
FIG. 1a shows an exemplary embodiment of a voltage measurement circuit for measurement of a single voltage source which implements bipolar junction transistors.

An exemplary embodiment of the voltage measurement circuit is described below with reference to FIG. 1a. The circuit depicted in FIG. 1a includes a measurement module 20a which accurately determines the voltage of a first voltage source 1a which is connected in series with an offset voltage source 2a. Thus, an output voltage is provided which is proportional to the voltage of first voltage source 1a without the offset voltage created by offset voltage source 2a. By virtue of the series connection of voltage sources 1a and 2a, the voltage of offset voltage source 2a is added to the voltage of first voltage source 1a. Thus, the voltage potential established between the positive terminal of first voltage source 1a and ground is the sum of the independent voltages of first voltage source 1a and offset voltage source 2a.

The measurement module 20a generally comprises a first resistor 3a which is connected to a first terminal (positive terminal) of first voltage source 1a. The first resistor 3a is selected so as to provide a high resistance to current flowing from the first terminal of first voltage source 1a. For example, the value of first resistor 3a may be 1 MΩ (megaohm) or greater.

The measurement module 20a of the exemplary embodiment comprises bipolar junction transistors (BJTs) 4a through 8a, where transistors 4a and 5a are pnp-type bipolar transistors and transistors 6a, 7a and 8a are npn-type bipolar transistors.

Further, first transistor 4a is connected to second transistor 5a so as to provide a first current mirror. The emitter of first transistor 4a is connected to a second terminal (negative terminal) of first voltage source 1a, and the emitter of second transistor 5a is connected to first resistor 3a. The first current mirror is formed by the connection of the base of first transistor 4a with the base of second transistor 5a, where the bases of first transistor 4a and second transistor 5a are further connected to the collector of first transistor 4a.

In addition, a third transistor 6a and a fourth transistor 7a are connected so as to provide a second current mirror. The second current mirror is formed by the connection of the base of third transistor 6a with the base of fourth transistor 7a, where the bases of third transistor 6a and fourth transistor 7a are further connected to the collector of fourth transistor 7a. Also, the collector of third transistor 6a is connected to the collector of first transistor 4a, and the collector of fourth transistor 7a is connected to the collector of second transistor 5a.

A fifth transistor 8a is connected to fourth transistor 7a such that the emitter of fourth transistor 7a is connected to the collector of fifth transistor 8a. Further, the base of fifth transistor 8a is connected to the emitter of third transistor 6a. A second resistor 9a is additionally connected between the emitter of third transistor 6a and a reference potential 12a. The resistance of second resistor 9a may also be selected so as to provide a high resistance value, such as 1 MΩ or greater. Further, reference potential 12a may be set equal to ground.

Further, a third resistor 10a is connected between the emitter of fifth transistor 8a and reference potential 12a. Current flowing through third resistor 10a establishes an output voltage 11a. Third resistor 10a is typically a lower resistance than first resistor 3a or second resistor 9a. For instance, in one exemplary embodiment, the value of third resistor 10a is 250 kΩ.

In operation, the measurement module 20a provides a first current path which is defined by first resistor 3a, transistors 5a, 7a and 8a and third resistor 10a. Also, a second current path is defined by transistors 4a and 6a and second resistor 9a. Although minor variations in current flowing in the first and second current paths occur due to the effects of the base currents from the first and second current mirrors, these effects are negligible. Thus, the currents flowing in the first current path and the second current path are substantially constant.

The first current mirror formed by transistors 4a and 5a provides for the constant current flow in the first current path. Similarly, the second current mirror formed by transistors 6a and 7a provides for the constant current flow in the second current path. Further, the ratio of current flowing in the first current path versus current flowing in the second current path is a function of the relative resistance values chosen for resistors 9a and 10a. Thus, in one example where the resistance value of third resistor 10a is ¼ of the resistance value of second resistor 9a, the current flowing in the first current path is substantially four times larger than the current flowing in the second current path. Also, the value of resistor 10a may be selected so as to provide for different output voltage levels. As discussed above, the output voltage is generally proportional to the voltage of the first voltage source 1a, such that the output voltage observed is typically some fractional value of the input voltage. Furthermore, the range of output voltages developed at output voltage 11a increases as the resistance value of third resistor 10a is increased. Accordingly, the voltage level may be tailored to a particular application by selecting an appropriate resistance value.

The output voltage 11a, which forms across third resistor 10a as a voltage that is proportional to the actual voltage of first voltage source 1a without offset voltage, is created by the operation of the first current mirror together with the second current mirror. Accordingly, the current established in the first current path provides for a series of voltage drops across the first resistor 3*a*, transistors 5*a*, 7*a*, and 8*a*, and finally across third resistor 10*a*. Furthermore, by virtue of the first and second current mirrors, currents which flow in the first and second current paths are substantially independent from variations in the offset voltage level. Also, the first and second current mirrors provide for stability of the currents as the operating temperature of the circuit varies. The fifth transistor 8*a* further provides for additional temperature stability and allows for greater independence of the generated currents from variations in offset voltage values, thereby providing for increased dynamic range in the offset voltage values.

Accordingly, the first and second current mirrors provide a constant current amplification to measure the voltage of a voltage source and turn the voltage into a current that represents to amplitude of the cell voltage measured. The generated current then passes through a resistor 10*a* which is referenced to a lower potential or ground 12*a*. The voltage that forms across resistor 10*a* converts the current back to a voltage (output voltage 11*a*) which represents the original cell voltage.

Thus, the voltage measurement circuit provides highly accurate output voltage values as measurement values even where the offset voltage is varied over a large range and even where operating temperatures change significantly. Therefore, voltage conversion can be achieved which is essentially independent of offset voltage and operating temperature.

In operation, the measurement module as described above allows for precise voltage measurement to be obtained even where the operating temperature varies significantly and the offset voltage varies. For instance, when the voltage measurement circuit as described above is subjected to temperature variations and offset voltage level variations, a maximum error of 4 millivolts is observed for temperature variations from −25° C. to 75° C. Also, an error of 8 millivolts is observed when the offset voltage is varied from 24 to 32 volts.

An additional characteristic of the voltage measurement circuit is low current consumption, which is desirable in applications such as monitoring voltages of battery cells. For instance, the voltage measurement circuit as described above draws approximately 10 microamps in operation. This minimal current consumption allows for enhanced efficiency in battery monitoring applications.

The voltage measurement circuit as described above can be applied to accurately measure the voltage of voltage sources such as electrochemical cells, or any other application which requires accurate measure of a voltage value which includes a offset voltage, such as measurement of signal levels, applications involving comparators for comparing signal levels, and telemetry systems where the accurate conversion and monitoring of voltage values is desirable.

Figure 1B:
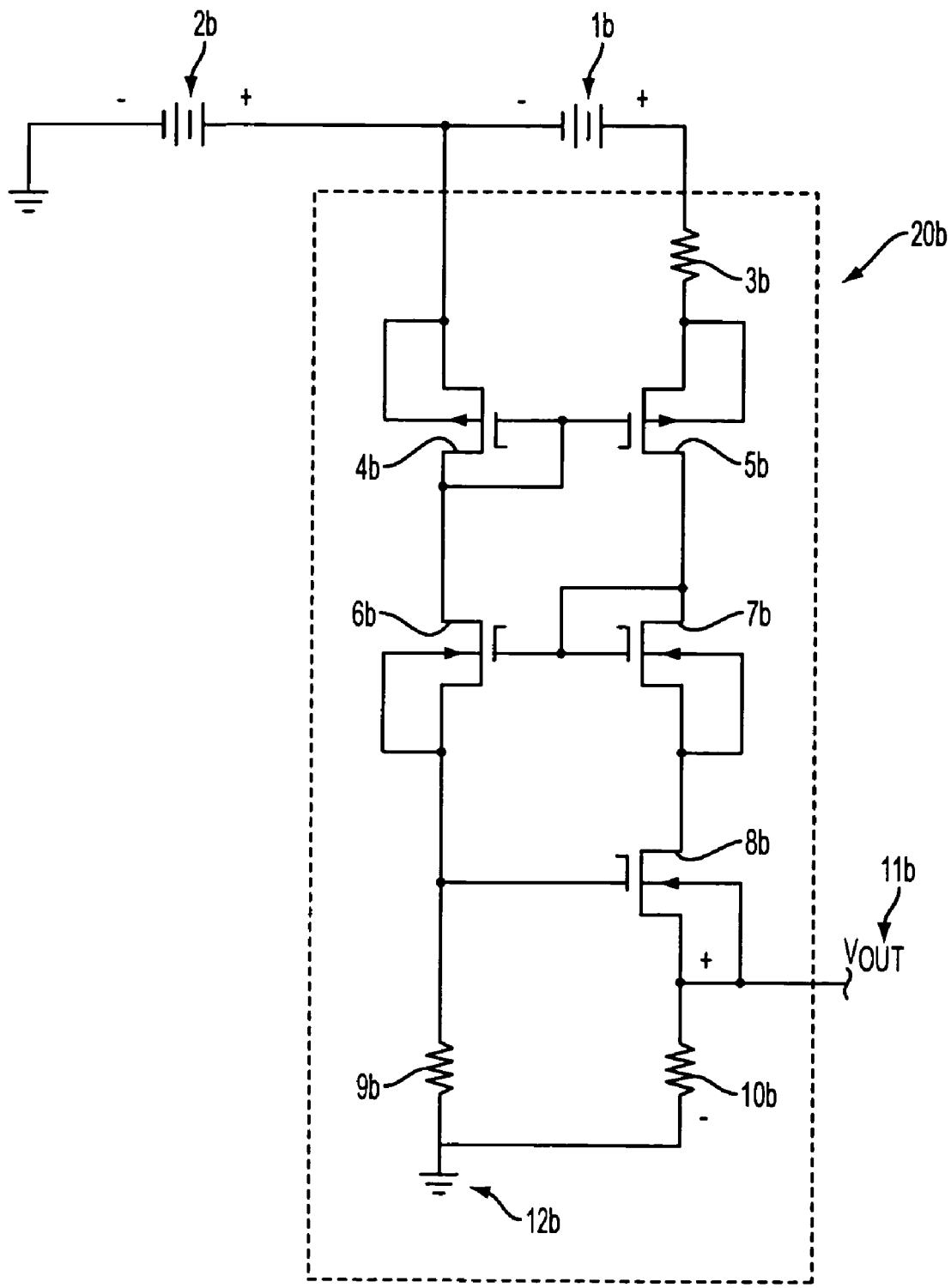
FIG. 1b shows an exemplary embodiment of a voltage measurement circuit measurement of a single voltage source which implements MOSFET transistors.

An additional exemplary embodiment of the voltage measurement circuit is shown in FIG. 1*b*. The construction of the circuit of FIG. 1*b* is similar to that shown in FIG. 1*a*, except that MOSFET transistors are used in place of bipolar junction transistors.

With reference to FIG. 1*b*, measurement module 20*b* generally comprises a first resistor 3*b* which is connected to a first terminal (positive terminal) of first voltage source 1*b*. The first resistor 3*b* is selected so as to provide a high resistance to current flowing from the first terminal of first voltage source 1*b*. In the present exemplary embodiment, the resistance value of first resistor 3*b* may be significantly greater than the first resistor of the previous exemplary embodiment due to the operational characteristics of MOSFET devices. For example, first resistor 3*b* may be selected as a 5 MΩ or greater resistance.

Measurement module 20*b* of the present exemplary embodiment comprises MOSFET transistors 4*b* through 8*b*, where transistors 4*b* and 5*b* are P-channel depletion-mode MOSFET transistors and transistors 6*b*, 7*b* and 8*b* are N-channel depletion-mode transistors.

Further, first transistor 4*b* is connected to second transistor 5*b* so as to provide a first current mirror. The source terminal of first transistor 4*b* is connected to a second terminal (negative terminal) of first voltage source 1*b*, and the source terminal of second transistor 5*b* is connected to first resistor 3*b*. Also, the bulk terminals of first transistor 4*b* and second transistor 5*b* are each connected to their respective source terminals. The first current mirror is formed by the connection of the gate terminal of first transistor 4*b* with the gate terminal of second transistor 5*b*, where the gate terminals of first transistor 4*b* and second transistor 5*b* are further connected to the drain terminal of first transistor 4*b*.

In addition, a third transistor 6*b* and a fourth transistor 7*b* are connected so as to provide a second current mirror. The second current mirror is formed by the connection of the gate terminal of third transistor 6*b* with the gate terminal of fourth transistor 7*b*, where the gate terminals of third transistor 6*b* and fourth transistor 7*b* are further connected to the drain terminal of fourth transistor 7*b*. Also, the drain of third transistor 6*b* is connected to the drain of first transistor 4*b* and the drain of fourth transistor 7*b* is connected to the drain of second transistor 8*b*. The bulk terminals of third transistor 6*b* and fourth transistor 7*b* are each connected to their respective source terminals.

A fifth transistor 8*b* is connected to fourth transistor 7*b* such that the source terminal of fourth transistor 7*b* is connected to the drain terminal of fifth transistor 8*b*. Further, the gate terminal of fifth transistor 8*b* is connected to the source terminal of third transistor 6*b*, and the bulk terminal of fifth transistor 8*b* is connected to its source terminal. A second resistor 9*b* is additionally connected between the source terminal of third transistor 6*b* and a reference potential 12*b*. The resistance of second resistor 9*b* may also be selected so as to provide a high resistance value, such as 5 MΩ or greater. Further, reference potential 12*b* may be set equal to ground.

Further, a third resistor 10*b* is connected between the source terminal of fifth transistor 8*b* and reference potential 12*b*. Current flowing through third resistor 10*b* establishes an output voltage 11*b*. Third resistor 10*b* is typically a lower resistance than first resistor 3*b* or second resistor 9*b*. For instance, in one exemplary embodiment, the value of third resistor is 2 MΩ.

The MOSFET measurement module 20*b* functions similar to the bipolar junction transistor measurement module 20*a* with respect to the operation of the first and second current mirrors and the establishment of an output voltage which is proportional to the measured input voltage, thus description in detail is not included herein. However, measurement module 20*b* provides for enhanced measurement accuracy and stability over variations in operating temperature as compared to the bipolar transistor circuit due to the use of MOSFET transistors.

For instance, higher resistance values for first through third resistors 3*b*, 9*b*, and 10*b* may be used in the MOSFET measurement module due to the operating characteristics of these devices. Accordingly, a significant improvement with respect to current consumption is achieved with the use of the MOSFET transistors. For example, the measurement module 20b depicted in FIG. 1b consumes approximately five times less current than measurement module 20a, which utilizes bipolar junction transistors.

Figure 2A:
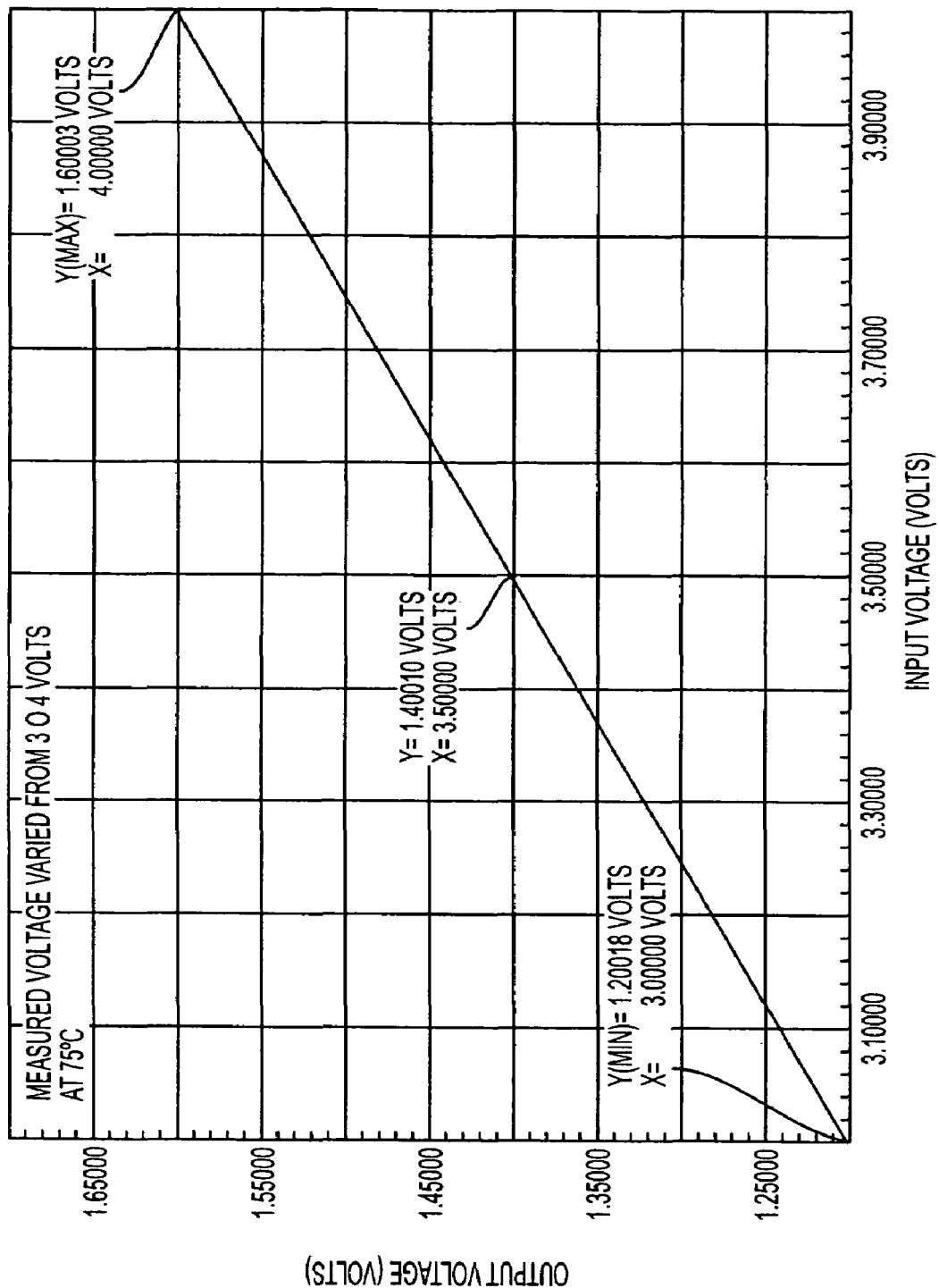
FIGS. 2a–2c are charts which show the values of input voltages and measured output voltages determined by a voltage measurement circuit which implements MOSFET transistors at operating temperatures of 75° C., 25° C., and −25° C., respectively.
Figure 2B:
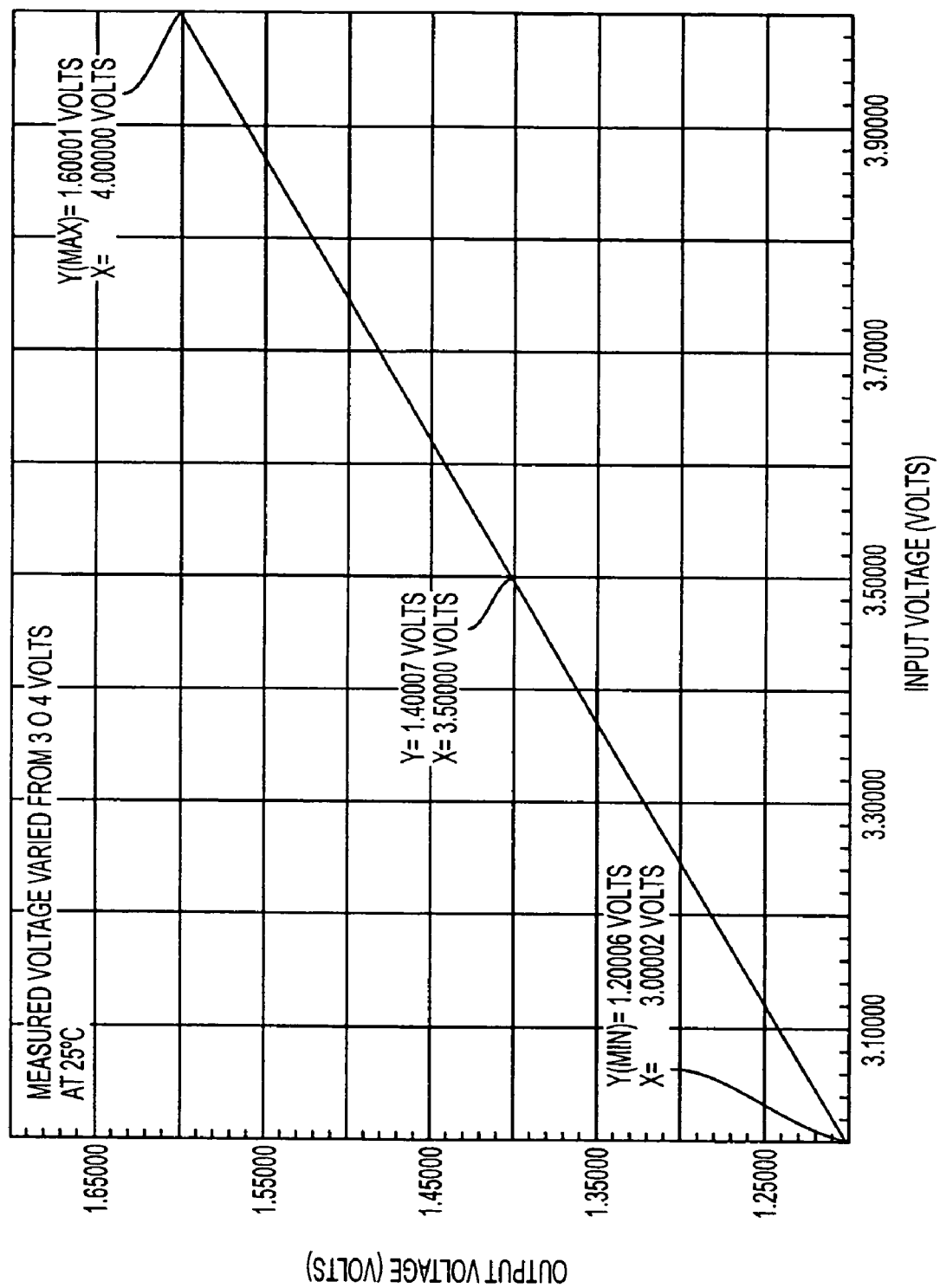
Figure 2C:
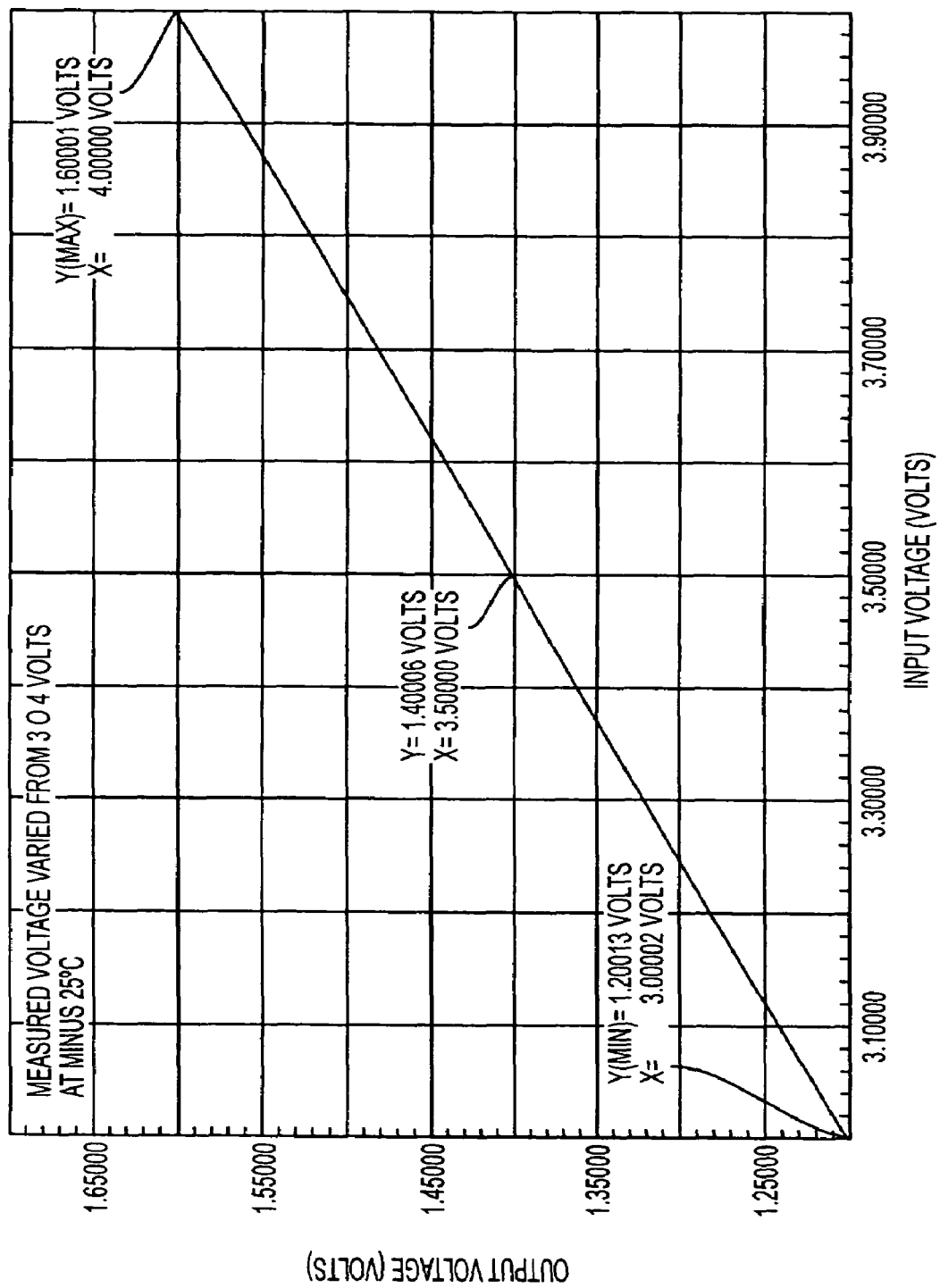

In addition, a measurement module circuit as depicted in FIG. 1b demonstrates enhanced stability over variations in operating temperature. FIGS. 2a–2c show plots of the measured input voltage versus the output voltage determined by measurement module 20b as the input voltage varies from 3 to 4 volts. Three data points are provided on each of the plots, which show the output voltage observed for input voltages (i.e., the actual voltage of the voltage source without the offset voltage) of 3 volts, 3.5 volts, and 4 volts. In FIG. 2a, the input voltage is measured at 75° C., and output voltages of 1.20018 volts, 1.40010 volts, and 1.60003 volts is observed. In FIG. 2b, the input voltage is measured at 25° C., and output voltages of 1.20006 volts, 1.40007 volts, and 1.60001 volts is observed. Finally, in FIG. 2c, the input voltage is measured at −25° C., and output voltages of 1.20013, 1.40006 volts, and 1.60001 volts is observed. From the results depicted in FIGS. 2a–2c, the effect of varying temperature on the accuracy of the measurement circuit of FIG. 1a does not exceed 0.12 mV. Accordingly, very precise voltage measurement can be obtained even in operating conditions where the temperate variations are extreme.

A further application of the voltage measurement circuit is described with reference to FIG. 3, which depicts an application involving measurement of the voltages of a plurality of electrochemical cells. The plurality of electrochemical cells 30 through 35 are connected in a series electrical connection.

For each of the electrochemical cells 31 through 35, measurement modules 20-1 through 20-5 are provided. In one exemplary embodiment, measurement modules 20-1 through 20-5 are equivalent to the bipolar junction transistor measurement module 20a of FIG. 1a. In an additional exemplary embodiment, measurement modules 20-1 through 20-5 are equivalent to the MOSFET measurement module 20b of FIG. 1b.

Further, each measurement module operates to provide an output voltage value that is proportional to the voltage value of the respective electrochemical cell without the presence of offset voltage due to the series connection of the cells. Thus, measurement module 20-1 is connected to electrochemical cell 31 and provides output voltage 41. Likewise, electrochemical cells 32 through 35 are each respectively connected to measurement modules 20-2 through 20-5, thereby providing output voltages 42 through 45.

Figure 3:
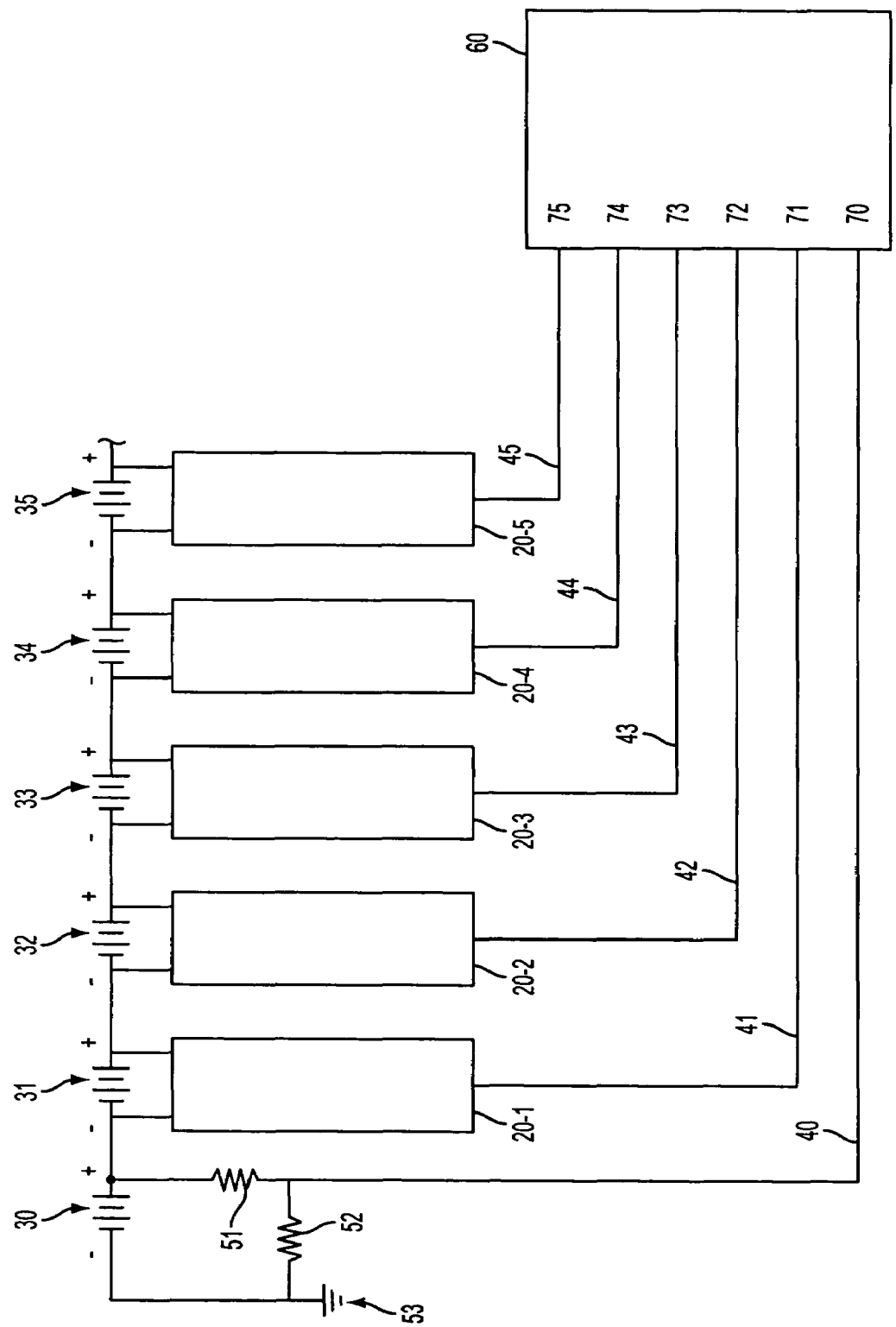
FIG. 3 shows an exemplary embodiment of the voltage measurement circuit including a plurality of measurement modules for measurement of multiple electrochemical cells.

At least one of the electrochemical cells, shown as 30 in FIG. 3 is connected to a resistor divider network designated by resistors 51 and 52, wherein resistor 52 is connected to ground 53 and resistor 51 provides an output voltage value 40. The resistor divider network is used in the first stages of the series connection of the electrochemical cells when the offset voltage is zero, as is the case in the first cell in the series connection, or for subsequently connected cells when the offset voltage is insufficient to operate the measurement module.

Accordingly, a plurality of cell output voltages 40 through 45 are provided. These output voltages may be further applied to the inputs 70–75 of a processor 60 which receives the voltage values and controls a process, such as regulating the charging of the cells. The processor 60 shown in FIG. 3 has six inputs. However, the voltage measurement circuit may be easily expanded to include further measurement modules in the case where additional electrochemical cells are provided in a single series connection. Additionally, a mutliplexor (not shown) may be provided which receives output voltages and supplies a multiplexed signal to a processor. Further, an analog to digital conversion of the output voltages may be incorporated in order to provide for digital signals to be used for cell monitoring.

Electrochemical cells 30 through 35 may be lithium ion cells, which typically have voltage values from 1.0 to 5.0 volts. However, electrochemical cells with higher voltage values may also be used with the voltage measurement circuit described herein, such as Nickel Cadmium (NiCad), Nickel Metal Hydride (NMH), and lead acid batteries.

Also, each of the output voltage signals may be applied to an operational amplifier (not shown) so as to provide a voltage gain in order to convert the voltage to a compatible voltage level for a particular application.

In addition to the exemplary embodiments described above with bipolar junction transistors and depletion-mode MOSFETs, the present invention contemplates the use of other devices. For instance, the measurement circuit described may be implemented with JFET transistors or enhancement-mode MOSFETs to provide the desired voltage conversion. Further, three terminal MOSFETs may be used.

In addition, the circuit may be constructed of discrete components, or the transistors which form each of the current mirrors may be matched pairs on an integrated circuit. Also, the measurement modules of the voltage conversion circuit may be constructed as a single integrated circuit, thereby reducing the space occupied by the circuit.

According to an aspect of the present invention, cell voltages can be monitored with significantly reduced parasitic load currents as a result of the minimal current required for operation of the voltage measurement circuit.

According to a further aspect, voltages of a plurality of cells can be monitored with a reduced cost over conventional circuits which are based on a plurality of operational amplifiers as a result of the smaller cost of the components of the present voltage measurement circuit.

Moreover, the voltage values measured by the present invention are less susceptible to variations induced by changing offset voltage and operating temperature.

In addition, the use of low cost components is possible due to the use of inexpensive discreet transistors that can be selected for high voltage use, thus enabling the circuit to grow to 16 or more cells without violating the absolute limits of components, such as processors and multiplexors used in voltage monitoring applications.

Further, the very low power of the circuit is not affected by the total offset voltage from a series connection of a large number of cells, such that power to the circuit need not be turned off when in a device which incorporates the measurement circuit is storage. Thus, the circuit can be operated at all times without a large energy consumption, which would otherwise increase the discharge rate of the batteries.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A voltage measurement circuit for converting a voltage of a first voltage source connected in series with an offset voltage source to an output voltage, comprising:
a first resistor connected to a first terminal of the first voltage source;

a first transistor and a second transistor connected as a first current mirror, wherein the first transistor is connected to a second terminal of the first voltage source and the second transistor is connected to the first resistor;

a third transistor and a fourth transistor connected as a second current mirror, wherein the third transistor is connected to the first transistor, and the fourth transistor is connected to the second transistor;

a fifth transistor connected to the fourth transistor;

a second resistor connected between the third transistor and a reference potential; and a third resistor connected between the fifth transistor and the reference potential, wherein an output voltage formed by a current flowing through the third resistor is proportional to the voltage of the first voltage source.

2. The voltage measurement circuit of claim 1, wherein the first transistor and the second transistor are pnp bipolar junction transistors which are connected to each other by their bases, and the bases of the first transistor and second transistor are connected to the collector of the first transistor.

3. The voltage measurement circuit of claim 2, wherein the third transistor and the fourth transistor are npn bipolar junction transistors which are connected to each other by their bases, and the bases of the third transistor and fourth transistor are connected to the collector of the fourth transistor.

4. The voltage measurement circuit of claim 3, wherein the fifth transistor is an npn bipolar junction transistor and the base of the fifth transistor is connected to the emitter of the third transistor.

5. The voltage measurement circuit of claim 1, wherein the first transistor and the second transistor are P-channel MOSFET transistors which are connected to each other by their gate terminals, and the gate terminals of the first transistor and second transistor are connected to the drain terminal of the first transistor.

6. The voltage measurement circuit of claim 5, wherein the third transistor and the fourth transistor are N-channel MOSFET transistors which are connected to each other by their gate terminals, and the gate terminals of the first transistor and second transistor are connected to the drain terminal of the first transistor.

7. The voltage measurement circuit of claim 6, wherein the fifth transistor is an N-channel MOSFET transistor and the gate terminal of the fifth transistor is connected to the source terminal of the third transistor.

8. The voltage measurement circuit of claim 1, wherein the output voltage is applied to an input of a processor.

9. The voltage conversion circuit of claim 1, wherein the reference potential is ground.

10. The voltage measurement circuit of claim 1, wherein the first voltage source is at least one electrochemical cell and the offset voltage source is at least one other electrochemical cell connected in series with the first voltage source.

11. A voltage measurement circuit for converting voltages of a plurality of electrochemical cells connected in series to output voltages which are independent of offset voltage, comprising:

a plurality of electrochemical cells connected in series;

for each respective electrochemical cell, a measurement module which comprises:

a first resistor connected to a first terminal of said respective electrochemical cell;

a first transistor and a second transistor connected as a first current mirror, wherein the first transistor is connected to a second terminal of said respective electrochemical cell and the second transistor is connected to the first resistor;

a third transistor and a fourth transistor connected as a second current mirror, wherein the third transistor is connected to the first transistor, and the fourth transistor is connected to the second transistor;

a fifth transistor connected to the fourth transistor;

a second resistor connected between the third transistor and a reference potential; and a third resistor connected between the fifth transistor and the reference potential, wherein an output voltage formed by a current flowing through the third resistor is proportional to the voltage of the respective electrochemical cell.

12. The voltage measurement circuit of claim 11, wherein the output voltages of the measurement modules are applied to inputs of a processor for monitoring the voltages of the plurality of electrochemical cells.

13. The voltage measurement circuit of claim 11, wherein the first transistor and the second transistor are pnp bipolar junction transistors which are connected to each other by their bases, and the bases of the first transistor and second transistor are connected to the collector of the first transistor.

14. The voltage measurement circuit of claim 13, wherein the third transistor and the fourth transistor are npn bipolar junction transistors which are connected to each other by their bases, and the bases of the third transistor and fourth transistor are connected to the collector of the fourth transistor.

15. The voltage measurement circuit of claim 14, wherein the fifth transistor is an npn bipolar junction transistor and the base of the fifth transistor is connected to the emitter of the third transistor.

16. The voltage measurement circuit of claim 11, wherein the first transistor and the second transistor are P-channel MOSFET transistors which are connected to each other by their gate terminals, and the gate terminals of the first transistor and second transistor are connected to the drain terminal of the first transistor.

17. The voltage measurement circuit of claim 16, wherein the third transistor and the fourth transistor are N-channel MOSFET transistors which are connected to each other by their gate terminals, and the gate terminals of the first transistor and second transistor are connected to the drain terminal of the first transistor.

18. The voltage measurement circuit of claim 17, wherein the fifth transistor is an N-channel MOSFET transistor and the gate terminal of the fifth transistor is connected to the source terminal of the third transistor.

19. The voltage measurement circuit of claim 11, further comprising at least one other electrochemical cell connected in series with the plurality of electrochemical cells, wherein the voltage of the at least one other electrochemical cells is determined by a voltage divider circuit.

* * * * *